(12) United States Patent
Dorai et al.

(10) Patent No.: US 7,767,986 B2
(45) Date of Patent: Aug. 3, 2010

(54) METHOD AND APPARATUS FOR CONTROLLING BEAM CURRENT UNIFORMITY IN AN ION IMPLANTER

(75) Inventors: Rajesh Dorai, Woburn, MA (US); Peter F. Kurunczi, Cambridge, MA (US); Alexander S. Perel, Danvers, MA (US); Wilhelm P. Platow, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 265 days.

(21) Appl. No.: 12/143,144

(22) Filed: Jun. 20, 2008

(65) Prior Publication Data

US 2009/0314962 A1 Dec. 24, 2009

(51) Int. Cl.
*H01J 37/08* (2006.01)
*H01J 37/15* (2006.01)
*H01J 27/02* (2006.01)

(52) U.S. Cl. .............................. 250/492.21; 250/423 R; 250/396 R; 250/397; 250/398; 315/111.81

(58) Field of Classification Search .................. None
See application file for complete search history.

(56) References Cited

U.S. PATENT DOCUMENTS

| | | | | |
|---|---|---|---|---|
| 4,588,955 | A * | 5/1986 | Anderson | 315/506 |
| 5,920,076 | A * | 7/1999 | Burgin et al. | 250/492.21 |
| 6,060,715 | A * | 5/2000 | England et al. | 250/492.21 |
| 6,486,480 | B1 * | 11/2002 | Leung et al. | 250/492.21 |
| 6,501,078 | B1 * | 12/2002 | Ryding et al. | 250/423 R |
| 6,534,775 | B1 * | 3/2003 | Harrington et al. | 250/492.21 |
| 6,617,595 | B1 * | 9/2003 | Okunuki | 250/492.22 |
| 6,635,889 | B2 * | 10/2003 | Tsukihara et al. | 250/492.2 |
| 6,863,020 | B2 | 3/2005 | Mitrovic et al. | |
| 6,916,401 | B2 | 7/2005 | Long | |
| 7,071,466 | B2 * | 7/2006 | Glukhoy | 250/287 |
| 7,075,095 | B2 * | 7/2006 | Kornfeld et al. | 250/492.21 |
| 7,087,913 | B2 * | 8/2006 | Goldberg et al. | 250/492.21 |
| 7,271,399 | B2 * | 9/2007 | Bong et al. | 250/492.21 |
| 7,598,505 | B2 * | 10/2009 | Benveniste | 250/492.21 |
| 7,629,589 | B2 * | 12/2009 | Hwang et al. | 250/396 R |
| 7,635,850 | B2 * | 12/2009 | Yamashita et al. | 250/492.21 |
| 7,655,928 | B2 * | 2/2010 | Tekletsadik | 250/492.1 |
| 2005/0199822 | A1 * | 9/2005 | Saini et al. | 250/398 |
| 2007/0295901 | A1 * | 12/2007 | Kellerman et al. | 250/283 |

(Continued)

FOREIGN PATENT DOCUMENTS

JP 61-201774 A 9/1986

*Primary Examiner*—David A Vanore

(57) ABSTRACT

An electrode assembly for use with an ion source chamber or as part of an ion implanter processing system to provide a uniform ion beam profile. The electrode assembly includes an electrode having an extraction slot with length L aligned with an aperture of the ion source chamber for extracting an ion beam. The electrode includes a plurality of segments partitioned within the length of the extraction slot where each of the segments is configured to be displaced in at least one direction with respect to the ion beam. A plurality of actuators are connected to the plurality of electrode segments for displacing one or more of the segments. By displacing at least one of the plurality of electrode segments, the current density of a portion of the ion beam corresponding to the position of the segment within the extraction slot is modified to provide a uniform current density beam profile associated with the extracted ion beam.

19 Claims, 4 Drawing Sheets

U.S. PATENT DOCUMENTS

2009/0236547 A1* 9/2009 Huang et al. ............ 250/492.21
2009/0314962 A1* 12/2009 Dorai et al. ............ 250/492.21
2010/0065761 A1* 3/2010 Graf et al. ............... 250/492.21

* cited by examiner

METHOD AND APPARATUS FOR CONTROLLING BEAM CURRENT UNIFORMITY IN AN ION IMPLANTER

BACKGROUND OF THE INVENTION

1. Field of the Invention

Embodiments of the invention relate to the field of semiconductor device fabrication. More particularly, the present invention relates to an apparatus and method for controlling beam current uniformity in the ion beam extraction region of an ion implanter.

2. Discussion of Related Art

Ion implantation is a process used to dope ions into a work piece. One type of ion implantation is used to implant impurity ions during the manufacture of semiconductor substrates to obtain desired electrical device characteristics. An ion implanter generally includes an ion source chamber which generates ions of a particular species, a series of beam line components to control the ion beam and a platen to secure the wafer that receives the ion beam. These components are housed in a vacuum environment to prevent contamination and dispersion of the ion beam. The beam line components may include a series of electrodes to extract the ions from the source chamber, a mass analyzer configured with a particular magnetic field such that only the ions with a desired mass-to-charge ratio are able to travel through the analyzer, and a corrector magnet to provide a ribbon beam which is directed to a wafer orthogonally with respect to the ion beam to implant the ions into the wafer substrate. The ions lose energy when they collide with electrons and nuclei in the substrate and come to rest at a desired depth within the substrate based on the acceleration energy. The depth of implantation into the substrate is based on the ion implant energy and the mass of the ions generated in the source chamber. Typically, arsenic or phosphorus may be doped to form n-type regions in the substrate and boron, gallium or indium are doped to create p-type regions in the substrate.

The series of electrodes are regulated at particular voltages with respect to ground to extract ions from the ion source chamber. For ribbon beams each of the electrodes include a slot having a particular length to extract the ions into a beam for downstream wafer implantation. When an ion beam is extracted, variations in beam related characteristics, such as contaminants, pressure, temperature, beam drift etc. influence beam uniformity. FIG. 1 illustrates a plot of beam position across the length of an elongated slot of an extraction electrode against beam current densities. As can be seen, the beam profile includes a plurality of variations in beam current densities within the range of ±2 mA/cm for positions −125 mm to approximately 75 mm. It is believed that these non-uniformities are the result of various electrode characteristics. Ideally, the current density of the beam components would be constant about point E. The disparity in uniformity along the length of the electrode slot compromises the uniformity of the beam at wafer implantation. Prior attempts to correct for these non-uniformities include providing a segmented electrode with conducting sections and insulating sections. The insulating sections are used to prevent interference between the electrode sections. Another attempt at correcting for these non-uniformities included providing a plurality of insulating rings surrounding a corresponding electrode segment. Actuators are used to displace only the insulating ring portions perpendicular to the electrode segments to control the power delivered to each electrode segment. However, these prior attempts have not sufficiently corrected the non-uniformities resulting from extraction of an ion beam from an ion source chamber. In addition, corrector magnet rods and poles may also be employed in ion implanters to provide beam uniformity tuning. However, this may require long tune times for certain desired beam profile features. Thus, there is a need to provide a beam profile pre-tuning method utilizing an electrode configuration which is capable of extracting an ion ribbon beam having a uniform beam profile for wafer implantation.

SUMMARY OF THE INVENTION

Exemplary embodiments of the present invention are directed to a segmented electrode assembly. In an exemplary embodiment, a segmented electrode assembly is used with an ion source chamber. The electrode assembly comprises an electrode having a slot with length L aligned with an aperture of the ion source chamber for extracting an ion beam. The electrode is partitioned into a plurality of electrode segments defined at least within the length L of the extraction slot of the electrode. Each of the electrode segments is configured to be displaced in at least one direction with respect to the ion beam extracted from the ion source chamber. A plurality of actuators are connected to the plurality of electrode segments for displacing one or more of the segments. The ion beam extracted from the ion source chamber has a current density profile. The displacement of at least one of the electrode segments modifies the current density of a portion of the ion beam corresponding to the position of the segment within the extraction slot region to provide a uniform current density ion beam profile.

DESCRIPTION OF EMBODIMENTS

Figure 1:
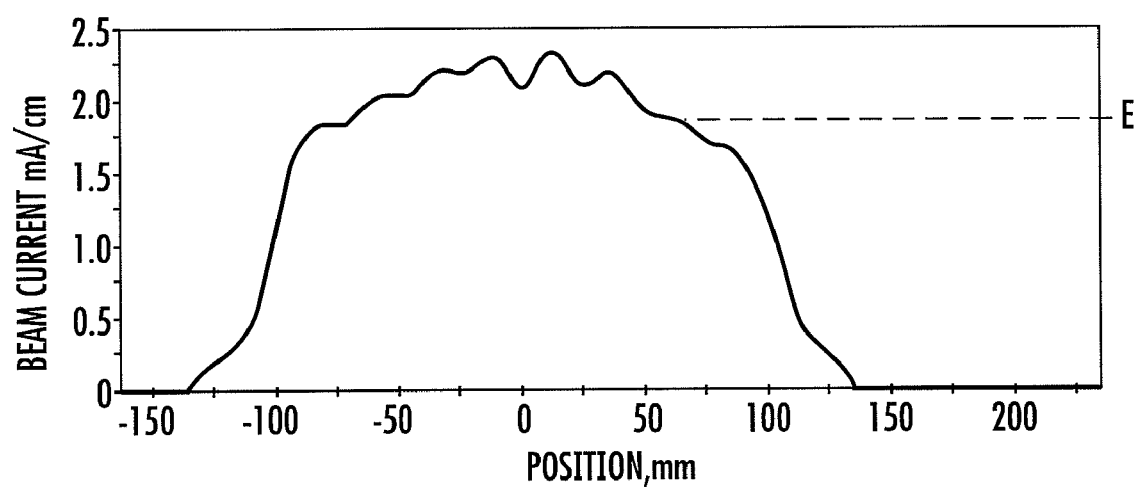
FIG. 1 is a graph illustrating ribbon beam profile generated from an ion source chamber.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
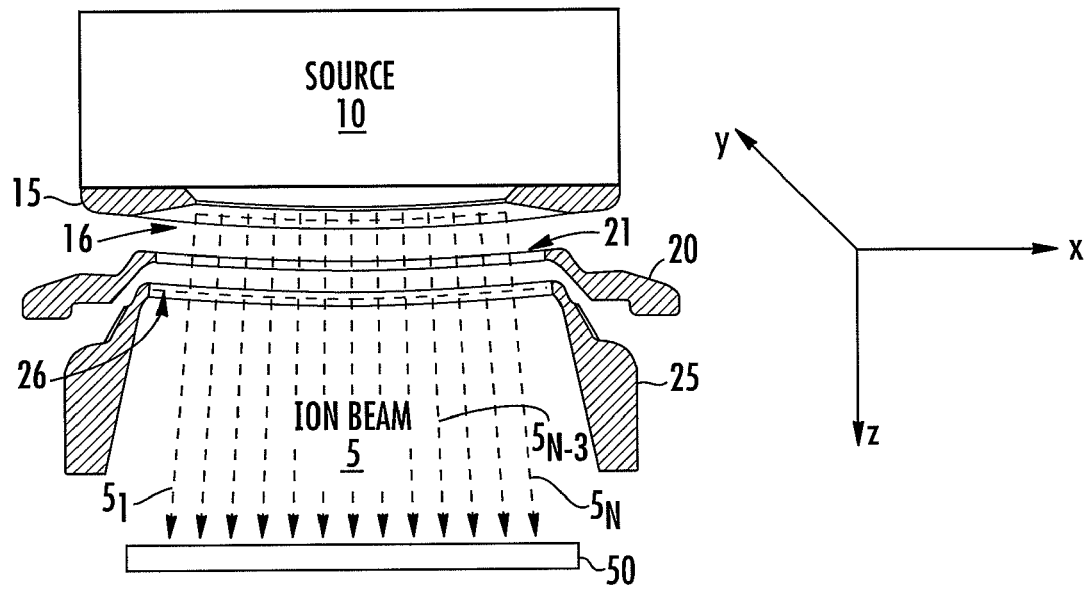
FIG. 2 is a top plan view of an exemplary ion source chamber together with a three (3) electrode configuration to extract an ion beam in accordance with an embodiment of the present invention.

FIG. 2 is a top plan view of an exemplary ion source chamber 10 together with a three (3) extraction electrode configuration (electrodes 15, 20 and 25) to extract an ion beam 5 for implantation into the surface of wafer 30. It should be understood that a plurality of beam line components may be disposed between ground electrode 25 and wafer 50 to control the ion beam. Beam line components may include a mass analyzer configured with a particular magnetic field such that only the ions with a desired mass-to-charge ratio are able to travel through the analyzer, a corrector magnet to provide a ribbon beam which is scanned over the surface of wafer 50 orthogonally with respect to the ion beam to implant the ions into the wafer substrate, and a platen to secure the wafer that receives the ion beam. However, for illustrative purposes, these intermediate components have been omitted.

Ion source chamber 10 typically includes a heated filament which ionizes a feed gas introduced into the chamber to form charged ions and electrons (plasma). The heating element may be, for example, an indirectly heated cathode (IHC). Different feed gases are supplied to the source chamber to generate ions having particular dopant characteristics. The ions are extracted from source chamber 10 via the standard three (3) electrode configuration comprising a plasma or arc slit electrode 15, suppression electrode 20 downstream from plasma electrode 15 and ground electrode 25 downstream from suppression electrode 20. These electrodes are used to create a desired electric field to focus ion beam 5 extracted from source chamber 10. Plasma electrode 15 includes a slot 16 through which ions extracted from ion source chamber 10 pass. Plasma electrode 15 may be biased at the same large potential as the source chamber 10. The slot 16 has a length that is significantly greater than its width to provide a high aspect ratio to form a ribbon ion beam. At high aspect ratios, the gas flow from the source is reduced which allows source 10 to function at higher plasma densities. Similarly, suppression electrode 20 includes slot 21 aligned with slot 16 which has a length significantly greater than its width. Suppression electrode 20 is connected to a power supply and is typically biased at a moderate negative value to prevent electrons from entering back into source chamber 10 and to assist in focusing ion beam 5. Ground electrode 25 is positioned downstream from suppression electrode 20 and is at ground potential. Ground electrode 25 includes slot 26 aligned with slot 16 of plasma electrode 15 and slot 21 of suppression electrode 20 which also has a length significantly greater than its width. The strength of the electric field generated by the electrodes can be tuned to a desired beam current to extract a particular type of ion beam from ion source chamber 10.

Ion ribbon beam 5 is extracted from ion source 10 in the z direction with electrode slots 16, 21 and 26 having respective lengths in the x direction. Ion ribbon beam 5 includes beam components $5_1$-$5_N$ which may have varying densities. For example, beam component $5_1$ may have a different current density then beam component $5_{N-3}$. The energy of these beam components may be in the range of 1-100 keV with the ribbon beam having current densities in the range of 0.3 mA/cm² to 1.7 mA/cm² which corresponds to a beam current of 10 mA-60 mA. In order to scan the wafer surface with the ion beam sufficiently, the wafer and the ion beam must move relative to each other. In one embodiment, wafer 50 is scanned with beam 5 by moving wafer 50 in a particular direction with respect to ribbon beam 5. Alternative embodiments in which beam 5 moves with respect to wafer 50 are also employed. If the ribbon beam is scanned on the surface of wafer 50 in direction y, variations in current density result in implantation non-uniformities in the wafer because each wafer region receives a different ion current dosage resulting in wafer "stripes." These non-uniformities result in current density problems at the surface of wafer 50.

Figure 3:
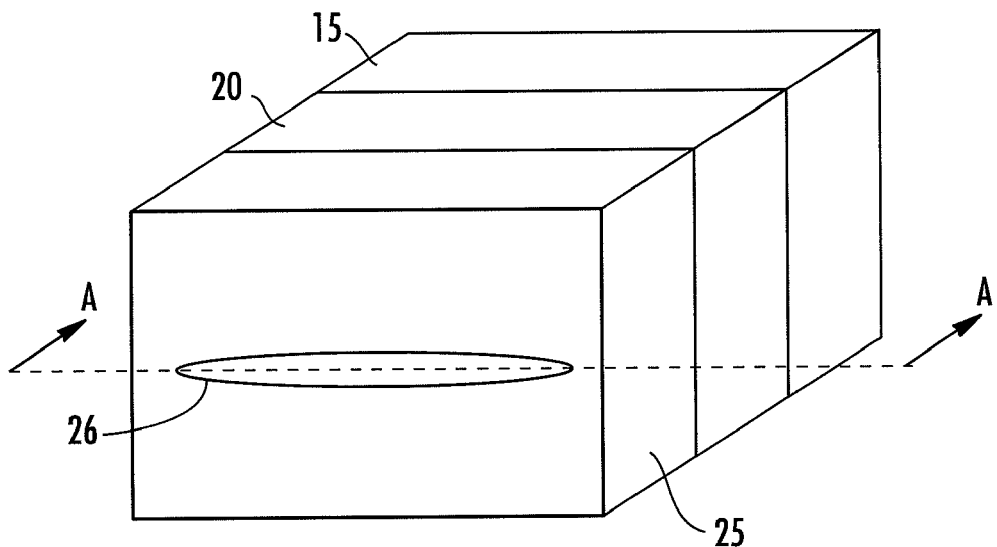
FIG. 3 is a perspective view of exemplary single mode ground electrode configured to correct current density non-uniformities in accordance with an embodiment of the present invention.

FIG. 3 is a perspective view of exemplary single mode ground electrode 25 configured to correct current density non-uniformities in beam 5. Ground electrode 25 includes a centrally disposed slot 26 through which ion ribbon beam 5 is extracted. Again ground electrode 25 is at ground potential and functions with plasma electrode 15 and suppression electrode 20 to extract a beam of desired energy. Ground electrode 25 may also be configured as a dual mode electrode having a plurality of slots for high and low energy extraction. Slot 26 has a length of, for example, 70 mm and a height of 5.5 mm-7 mm that may vary depending on whether the ions to be extracted have high or low energies.

Figure 4A:
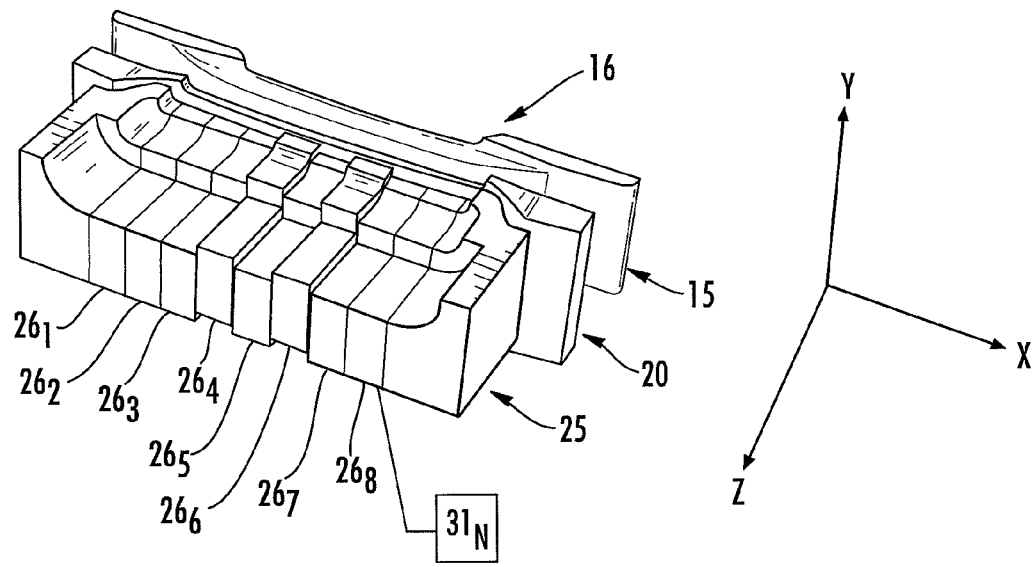
FIG. 4A is a cut-away sectional view of the three electrode configuration taken along lines A-A of the ground electrode shown in FIG. 3 in accordance with an embodiment of the present invention.

FIG. 4A is a cut-away sectional view of the three (3) electrode configuration taken along lines A-A of ground electrode 25 in the z direction parallel to the extracted beam path. The cut-away perspective view illustrates ground electrode 25, suppression electrode 25 and plasma electrode 15 in alignment with respective extraction slots 26, 21 and 16. In particular, slot 26 is aligned with slot 21 of suppression electrode 50 and slot 16 of plasma electrode 15. Within the region of slot 26, ground electrode 25 is partitioned into segments $26_1$-$26_8$. If, for example, extraction slot 26 of ground electrode 25 has a length of 70 mm, each segment $26_N$ may have an equal width of 8.75 mm (70 mm/8). Alternatively, the segments may have differing widths or only certain portions of the slot region may be segmented depending on the degree of control of beam uniformity required. Each segment is distinctly partitioned from an adjacent segment such that each segment can be displaced in either the z or y direction on the order of μm. Electrode displacement is accomplished by using, for example, a piezo actuator $31_N$ (or alternative mechanical device) shown in FIG. 4A as connected to electrode segment $26_8$. Additional actuators may also be employed for each of the electrode segments. A controller may also be used in combination with the piezo actuators as well as a user interface to control the magnitude of displacement of a particular segment. Exemplary electrode segments $26_4$ and $26_6$ are shown in FIG. 4A as being displaced in the y direction perpendicular to the ion beam extraction path. It has been found that displacement of one or more electrode segments locally increases beam current density in the beam profile. Various segments may be displaced individually or in combination with a plurality of segments to manipulate the current densities associated with a portion of an extracted ion beam. In this manner, beam current density within the beam profile may be tuned to correct for non-uniformities during wafer scanning to provide a flatter beam profile from that shown with reference to FIG. 1. Alternatively, segments $26_1$-$26_8$ may be displaced locally in the z direction between suppression electrode 20 and ground electrode 25 parallel to the beam path again on the order of μm. However, displacement in the z direction is limited by the close proximity of suppression electrode 20 from ground electrode 25.

Figure 4B:
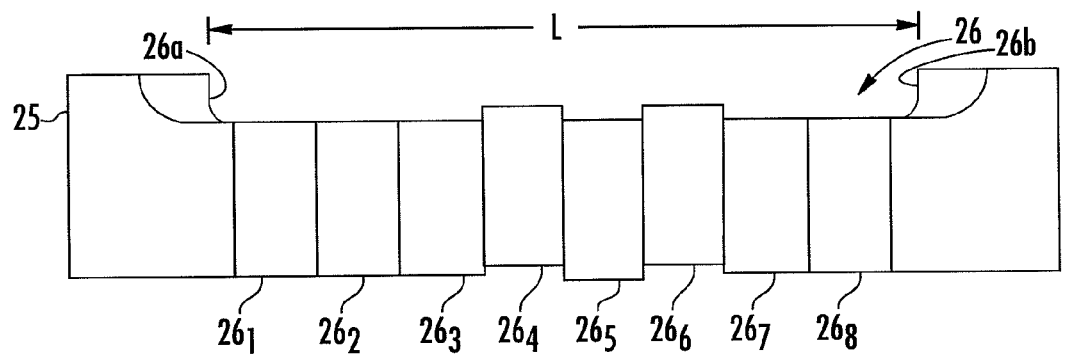
FIG. 4B is a side view in the z direction of the ground electrode shown in FIG. 4A in accordance with an embodiment of the present invention.

FIG. 4B is a side view in the z direction of electrode 20 having extraction slot 26 with length L. Ground electrode 20 is individually partitioned into segments $26_1$-$26_N$ where N=8 is this example. Again, each segment is distinctly partitioned from an adjacent segment such that one or more segments can be displaced in either the z or y direction on the order of μm. Segments $26_4$ and $26_6$ are shown, for example, as being displaced in the y direction perpendicular to the z direction beam path. The partitioned segments $26_1$-$26_8$ are within the boundaries of slot 26 having length L. In particular, segment $26_1$ is within the boundary of a first end 26a of slot 26 and segment $26_8$ is within the boundary of second end 26b of slot 26. Only electrode segments within the slot area through which beam 5 passes are displaced. In this manner, local control of the beam current density in the beam profile is provided at a particular position along extraction slot length L by displacing one or more segments $26_1$-$26_N$. Each segment is distinctly partitioned from an adjacent segment such that each segment can be displaced in either the z or y direction on the order of μm using, for example, piezo actuators.

Figure 5:
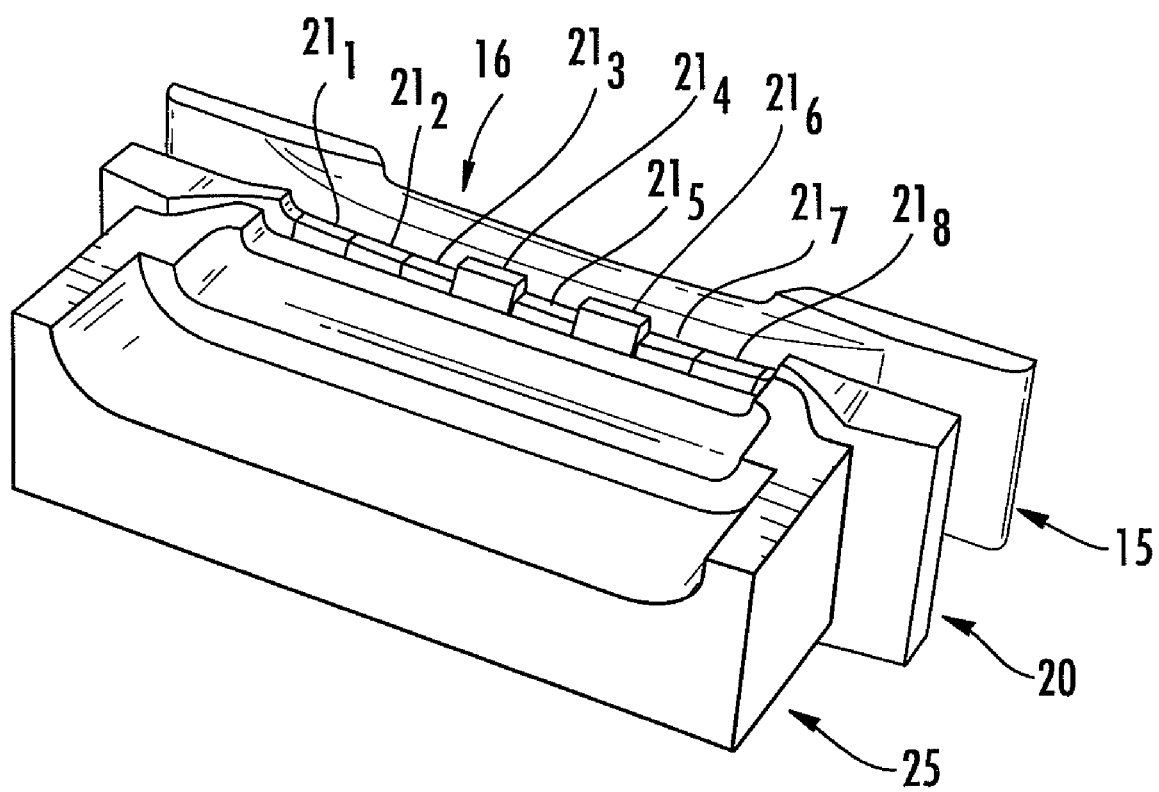
FIG. 5 is a cut-away sectional view of the three electrode configuration taken along lines A-A of the ground electrode shown in FIG. 3 in accordance with an embodiment of the present invention.

FIG. 5 is a cut-away sectional view of the three (3) electrode configuration taken along lines A-A of ground electrode 25 in the z direction parallel to the extracted beam path. The cut-away perspective view illustrates ground electrode 25, suppression electrode 25 and plasma electrode 15 in alignment with their respective extraction slots. In particular, slot 16 of plasma electrode 15 is aligned with extraction slot 21 of suppression electrode 20 which is aligned with extraction slot 26 of ground electrode 25. Within the region of slot 21 of suppression electrode 20, the electrode is partitioned into segments $21_1$-$21_8$. Similar to ground electrode slot 26, if extraction slot 21 of suppression electrode 20 has a length of 70 mm, each segment $21_N$ may have an equal width of 8.75 mm (70 mm/8). Alternatively, the segments may have differing widths or only certain portions of the slot region may be segmented depending on the degree of control of beam uniformity required. Again, each segment can be displaced in either the z or y direction on the order of μm using, for example, piezo actuators similar to that shown with reference to FIG. 4A. FIG. 5 illustrates exemplary segments $21_4$ and $21_6$ displaced in the y direction. Because suppression electrode 20 is usually at a high voltage, for example 4-15 kV, the beam is extremely sensitive to any geometric changes in suppression electrode 20. In addition, displacement of suppression electrode segments are more complicated considering the high temperatures reached by both the plasma electrode 15 and suppression electrode 20. Because of these high temperatures, shielded rods may be employed to connect the segments $21_1$-$21_8$ to the piezo actuators to control displacement of the segments. By displacing individual segments of suppression electrode 20, beam current density within the beam profile may be tuned to correct for non-uniformities during wafer scanning. Alternatively, segments $21_1$-$21_8$ may be displaced locally in the z direction between suppression electrode 20 and plasma electrode 15 parallel to the beam path again on the order of μm. However, displacement in the z direction is limited by the close proximity of suppression electrode 20 from plasma electrode 25 as well as the high operating temperatures referenced above.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A segmented electrode assembly for use with an ion source chamber comprising:
    an electrode positioned downstream from said ion source, said electrode having a slot with length L aligned with an aperture of said ion source chamber for extracting an ion beam;
    a plurality of electrode segments defined at least within the length L of said extraction slot of said electrode, each of said segments configured to be displaced in at least one direction with respect to said ion beam; and
    a plurality of actuators connected to said plurality of electrode segments for displacing one or more of said segments.

2. The electrode assembly of claim 1 wherein the electrode is one of a plurality of extraction electrodes positioned adjacent to said aperture of said ion source.

3. The electrode assembly of claim 2 wherein said electrode is a ground electrode biased at ground potential.

4. The electrode assembly of claim 2 wherein said electrode is a suppression electrode positioned between a plasma electrode and a ground electrode.

5. The electrode assembly of claim 1 wherein the displacement of at least one of said electrode segments is in a direction perpendicular to the path of said ion beam.

6. The electrode assembly of claim 1 wherein the displacement of at least one of said electrode segments is in a direction parallel to the path of said ion beam.

7. The electrode assembly of claim 1 wherein N corresponds to the number of said plurality of electrode segments, each of said segments having equal widths defined by L/N.

8. The electrode assembly of claim 1 wherein said ion beam has a current density profile, the displacement of said at least one of said electrode segments modifies the current density of a portion of said ion beam corresponding to the position of said segment within said extraction slot uniformly with respect to said current density profile.

9. An ion implanter processing system comprising:
    an ion source chamber configured to receive a feed gas and generate ions having a particular energy and mass, said ion source chamber having an aperture through which said ions are extracted;
    a wafer positioned downstream of said ion source chamber for receiving said extracted ions in the form of an ion beam; and
    an electrode assembly disposed downstream from said ion source chamber for extracting ions from said source chamber in the form of an ion beam, said electrode assembly comprising at least one electrode having an extraction slot through which said ion beam passes, said electrode defined by a plurality of partitioned electrode segments at least within the length L of said extraction slot of said electrode, each of said segments configured to be displaced in at least one direction with respect to said ion beam.

10. The ion implanter processing system of claim 9 further comprising a plurality of actuators connected to said plurality of electrode segments for displacing one or more of said segments.

11. The ion implanter processing system of claim 9 wherein said electrode is a ground electrode biased at ground potential, said electrode assembly further comprising a plasma electrode positioned adjacent said ion source chamber aperture and a suppression electrode displaced between said plasma electrode and said ground electrode.

12. The ion implanter processing system of claim 9 wherein said electrode is a suppression electrode, said electrode assembly further comprising a plasma electrode positioned adjacent said ion source chamber aperture and a ground electrode displaced downstream of said suppression electrode, said suppression electrode disposed between said plasma electrode and said ground electrode.

13. The ion implanter processing system of claim 9 wherein said ion beam has a current density profile, the displacement of said at least one of said electrode segments modifies the current density of a portion of said ion beam corresponding to the position of said segment within said extraction slot uniformly with respect to said current density profile.

14. The ion implanter processing system of claim 9 wherein N corresponds to the number of said plurality of electrode segments, each of said segments having widths defined by L/N.

15. A method of adjusting the current density of an ion beam in an ion implanter comprising:
   extracting an ion beam from an aperture of an ion source chamber, said ion beam having a current density profile;
   aligning an electrode positioned downstream of said ion source chamber with said aperture;
   displacing in at least one direction, at least one of a plurality of electrode segments partitioned within said electrode, said segment displacement modifying the current density of at least a portion of said ion beam corresponding to the position of said segment relative to said ion beam such that said modification provides uniformity of said ion beam profile.

16. The method of claim 15 wherein said displacement of said electrode segment is in a direction parallel to said ion beam.

17. The method of claim 15 wherein said displacement of said electrode segment is in a direction perpendicular to said ion beam.

18. The method of claim 15 further comprising directing said uniform ion beam onto the surface of a wafer.

19. The method of claim 15 further comprising partitioning said plurality of electrode segments within a length L of an extraction slot of said electrode, said extraction slot aligned with an aperture of said ion source chamber.

* * * * *